United States Patent
Kamikawa et al.

(10) Patent No.: US 8,319,235 B2
(45) Date of Patent: Nov. 27, 2012

(54) NITRIDE SEMICONDUCTOR LIGHT-EMITTING DEVICE AND METHOD OF MANUFACTURING NITRIDE SEMICONDUCTOR LIGHT-EMITTING DEVICE

(75) Inventors: Takeshi Kamikawa, Mihara (JP); Yoshinobu Kawaguchi, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/785,981

(22) Filed: Apr. 23, 2007

(65) Prior Publication Data

US 2007/0246720 A1 Oct. 25, 2007

(30) Foreign Application Priority Data

Apr. 24, 2006 (JP) ................................. 2006-119500
Mar. 23, 2007 (JP) ................................. 2007-077362

(51) Int. Cl.
*H01L 33/00* (2010.01)
(52) U.S. Cl. ................ 257/98; 257/13; 257/79; 257/94; 257/E33.025; 257/E33.028; 257/E33.03; 257/E33.033; 257/E33.034; 257/E33.06; 257/E33.067; 257/E33.068; 257/E33.069
(58) Field of Classification Search ........... 257/E33.025, 257/E33.034, E33.03, 13, 79, 94, 98, E33.028, 257/E33.033, E33.06, E33.067, E33.068, 257/E33.069
See application file for complete search history.

(56) References Cited

U.S. PATENT DOCUMENTS

| | | | |
|---|---|---|---|
| 5,196,958 A | 3/1993 | Verbeek et al. | |
| 5,231,062 A | 7/1993 | Mathers et al. | |
| 5,741,724 A | 4/1998 | Ramdani et al. | |
| 5,777,792 A | 7/1998 | Okada et al. | |
| 6,249,534 B1 | 6/2001 | Itoh et al. | |
| 6,370,177 B1 * | 4/2002 | Genei et al. | 372/49.01 |
| 6,667,187 B2 | 12/2003 | Genei et al. | |
| 6,744,076 B2 | 6/2004 | Fukuyama et al. | |
| 6,812,152 B2 | 11/2004 | Lindström et al. | |
| 6,961,359 B2 | 11/2005 | Tojo et al. | |
| 7,564,884 B1 | 7/2009 | Ito et al. | |
| 2002/0006726 A1 | 1/2002 | Yamasaki et al. | |
| 2002/0024981 A1 | 2/2002 | Tojo et al. | |
| 2003/0015713 A1 | 1/2003 | Yoo | |
| 2003/0015715 A1 | 1/2003 | Sakai | |
| 2003/0048823 A1 * | 3/2003 | Yamanaka | 372/45 |

(Continued)

FOREIGN PATENT DOCUMENTS

JP 03-049281 3/1991

(Continued)

OTHER PUBLICATIONS

Ochiai Masanao, Machine Translation of JP 2002-100830, "Gallium Nitride Light-Emitting Element".*

(Continued)

*Primary Examiner* — Jay C Kim
(74) *Attorney, Agent, or Firm* — Harness, Dickey & Pierce, P.L.C.

(57) ABSTRACT

A nitride semiconductor light-emitting device including a coating film and a reflectance control film successively formed on a light-emitting portion, in which the light-emitting portion is formed of a nitride semiconductor, the coating film is formed of an aluminum oxynitride film or an aluminum nitride film, and the reflectance control film is formed of an oxide film, as well as a method of manufacturing the nitride semiconductor light-emitting device are provided.

7 Claims, 10 Drawing Sheets

U.S. PATENT DOCUMENTS

| | | | |
|---|---|---|---|
| 2004/0026710 A1* | 2/2004 | Tsuda et al. | 257/103 |
| 2004/0165635 A1 | 8/2004 | Sugimoto et al. | |
| 2004/0190576 A1* | 9/2004 | Matsuoka et al. | 372/49 |
| 2004/0213314 A1* | 10/2004 | Kunitsugu et al. | 372/49 |
| 2004/0238810 A1 | 12/2004 | Dwilinski et al. | |
| 2004/0245535 A1 | 12/2004 | D'Evelyn et al. | |
| 2005/0032344 A1 | 2/2005 | Hatano et al. | |
| 2005/0059181 A1 | 3/2005 | Yamane et al. | |
| 2005/0104162 A1 | 5/2005 | Xu et al. | |
| 2005/0127383 A1 | 6/2005 | Kikawa et al. | |
| 2005/0281304 A1 | 12/2005 | Mochida | |
| 2006/0093005 A1* | 5/2006 | Okunuki et al. | 372/49.01 |
| 2006/0133442 A1 | 6/2006 | Kondou et al. | |
| 2006/0280668 A1 | 12/2006 | Dmitriev et al. | |
| 2007/0014323 A1* | 1/2007 | Tachibana et al. | 372/46.01 |
| 2007/0138491 A1* | 6/2007 | Kawaguchi et al. | 257/94 |
| 2007/0200493 A1 | 8/2007 | Hsu et al. | |
| 2007/0205424 A1* | 9/2007 | Kamikawa et al. | 257/94 |
| 2007/0210324 A1* | 9/2007 | Kawaguchi et al. | 257/96 |

FOREIGN PATENT DOCUMENTS

| | | |
|---|---|---|
| JP | 03-209895 | 9/1991 |
| JP | 09-162496 | 6/1997 |
| JP | 09-194204 | 7/1997 |
| JP | 09-283843 | 10/1997 |
| JP | 2743106 | 2/1998 |
| JP | 2002-100830 | 4/2002 |
| JP | 2002-237648 | 8/2002 |
| JP | 2002-335053 | 11/2002 |
| JP | 2005-175111 A | 6/2005 |
| JP | 2005-340625 | 12/2005 |

OTHER PUBLICATIONS

Office Action for related U.S. Appl. No. 11/638,582 dated Jun. 12, 2008.
Office Action for related U.S. Appl. No. 11/638,581 dated Jul. 10, 2008.
Office Action for related U.S. Appl. No. 11/713,761 dated Sep. 4, 2008.
Office Action dated Mar. 23, 2009 from copending U.S. Appl. No. 11/638,581.
Office Action dated Apr. 6, 2009 from copending U.S. Appl. No. 11/713,761.
Advisory Action dated Aug. 3, 2009 in connection with U.S. Appl. No. 11/638,581.
U.S. Office Action dated Aug. 3, 2009 from copending U.S. Appl. No. 11/638,582.
U.S. Office Action dated Sep. 22, 2009 from copending U.S. Appl. No. 11/713,761.
U.S. Office Action dated Sep. 25, 2009 from copending U.S. Appl. No. 11/713,760.
U.S. Office Action dated Oct. 15, 2009 from copending U.S. Appl. No. 11/638,581.
U.S. Office Action dated Oct. 15, 2009 from copending U.S. Appl. No. 12/314,402.
Advisory Action dated Jan. 12, 2010 from copending U.S. Appl. No. 11/713,761.
Office Action dated Jun. 17, 2010 from copending U.S. Appl. No. 12/153,756.
Office Action mailed Oct. 7, 2010 from copending U.S. Appl. No. 12/805,644.
Office Action mailed Oct. 4, 2010 from copending U.S. Appl. No. 11/638,581.
Office Action mailed Oct. 7, 2010 from copending U.S. Appl. No. 12/382,530.
Office Action mailed Oct. 13, 2010 from copending U.S. Appl. No. 12/153,756.
Office Action mailed Oct. 28, 2010 from copending U.S. Appl. No. 11/713,761.
Office Action mailed Nov. 24, 2010 from co-pending U.S. Appl. No. 12/213,686.
Office Action mailed Dec. 6, 2010 from co-pending U.S. Appl. No. 12/314,402.
US Office Action mailed Mar. 18, 2011 issued in co-pending U.S. Appl. No. 12/153,756.
US Office Action mailed Mar. 21, 2011 issued in co-pending U.S. Appl. No. 12/213,686.
US Office Action mailed Apr. 22, 2011 issued in co-pending U.S. Appl. No. 12/382,530.
US Office Action mailed Apr. 26, 2011 issued in co-pending U.S. Appl. No. 11/638,581.
US Office Action mailed May 2, 2011 issued in co-pending U.S. Appl. No. 12/805,644.
US Office Action mailed Jun. 8, 2011 issued in co-pending U.S. Appl. No. 12/232,525.
US Office Action mailed Jun. 23, 2011 issued in co-pending U.S. Appl. No. 12/314,402.
US Office Action mailed Jul. 20, 2011 issued in co-pending U.S. Appl. No. 12/153,756.
Office Action dated May 24, 2010 from copending U.S. Appl. No. 11/638,581.
Office Action dated May 26, 2010 from copending U.S. Appl. No. 12/382,530.
Office Action dated May 26, 2010 from copending U.S. Appl. No. 12/314,402.
Hartnett, et al., "*Optical properties of ALON (aluminum oxynitride)*", Infrared Physics & Technology, vol. 39, pp. 203-211 (1998).
Dreer, et al., "*Statistical evaluation of refractive index, growth rate, hardness and Young's modulus of aluminium oxynitride films*", Thin Solid Films, vol. 354, pp. 43-49 (1999).
Advisory Action dated Apr. 21, 2010 from copending U.S. Appl. No. 11/638,582.
Office Action dated Mar. 16, 2010 from copending U.S. Appl. No. 11/713,761.
Office Action dated Feb. 26, 2010 from copending U.S. Appl. No. 11/638,581.
Office Action dated Jan. 26, 2010 from copending U.S. Appl. No. 11/638,582.
Office Action dated Jan. 25, 2010 from copending U.S. Appl. No. 12/153,756.
US Office Action mailed Oct. 7, 2011 issued in co-pending U.S. Appl. No. 11/638,582.
US Office Action mailed Oct. 7, 2011 issued in co-pending U.S. Appl. No. 12/382,530.
US Office Action mailed Oct. 7, 2011 issued in co-pending U.S. Appl. No. 12/232,525.
US Office Action mailed Nov. 15, 2011 issued in co-pending U.S. Appl. No. 12/153,756.
US Advisory Action mailed Oct. 4, 2011 issued in co-pending U.S. Appl. No. 12/314,402.
US Office Action mailed Oct. 12, 2011 issued in co-pending U.S. Appl. No. 12/805,644.
US Office Action mailed Nov. 9, 2011 issued in co-pending U.S. Appl. No. 12/314,402.
US Office Action mailed Apr. 27, 2012 issued in co-pending U.S. Appl. No. 13/200,357.
US Office Action mailed Mar. 29, 2012 issued in co-pending U.S. Appl. No. 11/638,582.
US Office Action mailed Oct. 13, 2011 issued in co-pending U.S. Appl. No. 11/638,581.
US Advisory Action mailed Jan. 30, 2012 issued in co-pending U.S. Appl. No. 11/638,581.
US Advisory Action mailed Jan. 26, 2012 issued in co-pending U.S. Appl. No. 12/232,525.
US Office Action mailed Feb. 16, 2012 issued in co-pending U.S. Appl. No. 12/805,644.
US Office Action mailed Feb. 28, 2012 issued in co-pending U.S. Appl. No. 12/314,402.
U.S. Advisory Action mailed Jun. 4, 2012 issued in co-pending U.S. Appl. No. 12/805,644.
U.S. Advisory Action mailed Jun. 1, 2012 issued in co-pending U.S. Appl. No. 12/153,314.

* cited by examiner

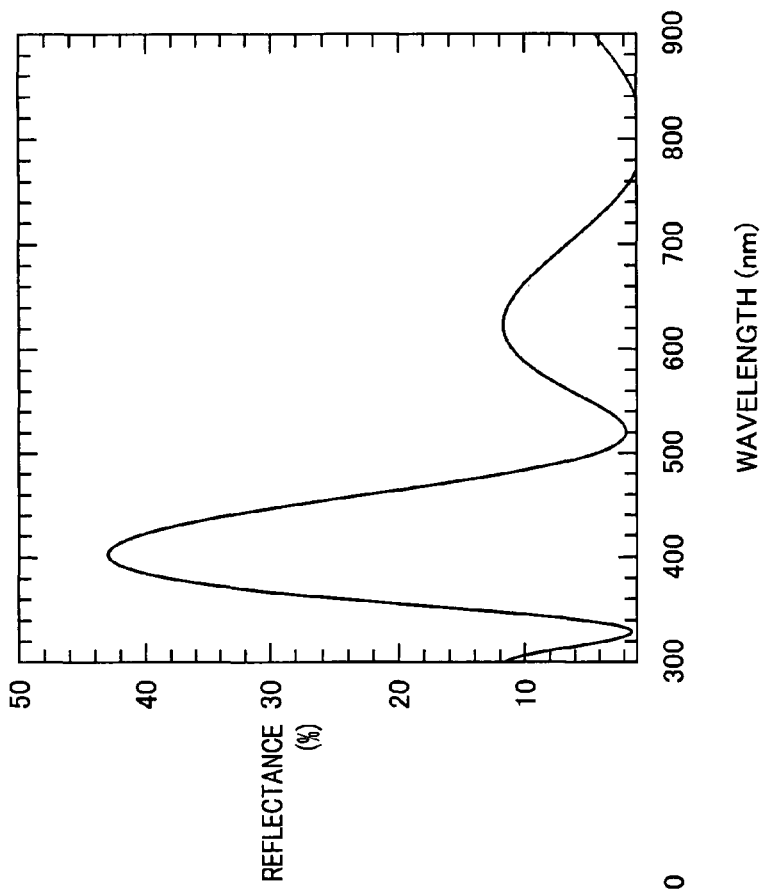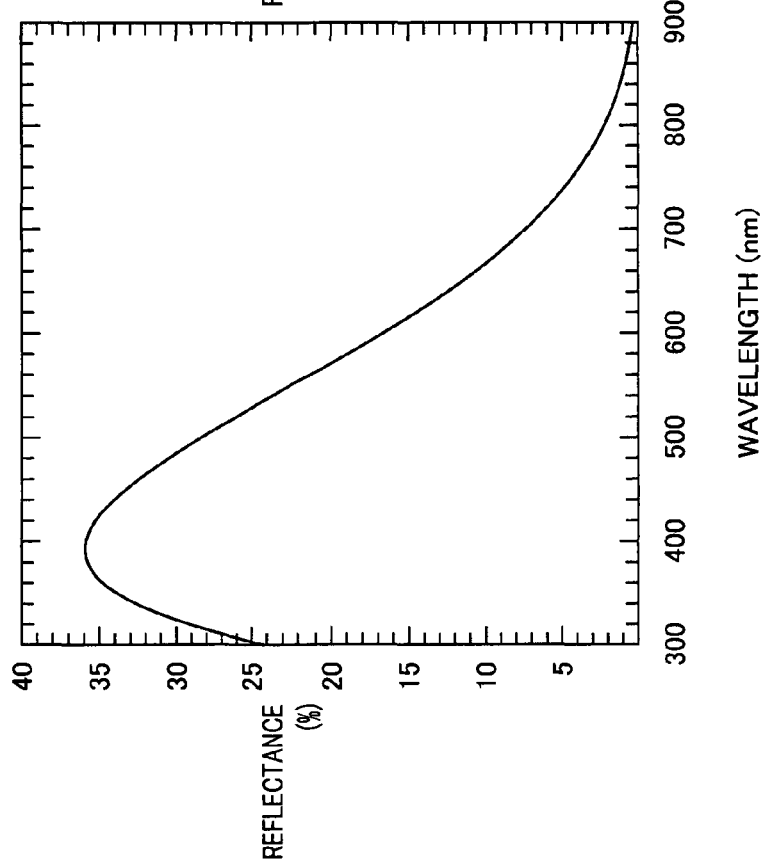

NITRIDE SEMICONDUCTOR LIGHT-EMITTING DEVICE AND METHOD OF MANUFACTURING NITRIDE SEMICONDUCTOR LIGHT-EMITTING DEVICE

This nonprovisional application is based on Japanese Patent Applications Nos. 2006-119500 and 2007-077362 filed with the Japan Patent Office on Apr. 24, 2006 and Mar. 23, 2007, respectively, the entire contents of which are hereby incorporated by reference.

FIELD OF THE INVENTION

The present invention relates to a nitride semiconductor light-emitting device and a method of manufacturing a nitride semiconductor light-emitting device.

DESCRIPTION OF THE BACKGROUND ART

In a nitride semiconductor laser device representing nitride semiconductor light-emitting devices, in order to control reflectance at a facet of a cavity with respect to laser beams, an AR (Anti-Reflectance) coating film for attaining the reflectance of approximately 10% at the facet of the cavity with respect to the laser beams may be formed on a light-emitting facet of the cavity that should serve as a light-emitting portion of the nitride semiconductor laser device, and an HR (High-Reflectance) coating film for attaining the reflectance at approximately 80 to 100% with respect to the laser beams may be formed on a light-reflecting facet of the cavity (see, for example, Patent Document 1 (Japanese Patent Laying-Open No. 09-162496), Patent Document 2 (Japanese Patent Laying-Open No. 2002-237648), and Patent Document 3 (Japanese Patent Laying-Open No. 03-209895)).

SUMMARY OF THE INVENTION

Here, in the nitride semiconductor laser device, the threshold value can be lowered by raising the reflectance at the light-emitting facet of the cavity with respect to the laser beams to thereby lower mirror loss. Meanwhile, as the light-emitting facet of the cavity of the nitride semiconductor laser device may be broken due to COD (Catastrophic Optical Damage), a COD level (optical output at the time when the light-emitting facet of the cavity is broken due to COD) should be raised.

If a single layer of a silicon oxide film, an aluminum oxide film, a titanium oxide film, a tantalum oxide film, a zinc oxide film, or the like is formed as an AR coating film on the light-emitting facet of the cavity of the nitride semiconductor laser device, however, improvement in the reflectance at the light-emitting facet of the cavity has not been sufficient. Alternatively, if a multi-layer film formed of a stack of an aluminum oxide film and a silicon oxide film is formed as an AR coating film in contact with the light-emitting facet of the cavity, the COD level has been low.

Moreover, as optical density at the light-emitting facet of the cavity is increased when the reflectance at the light-emitting facet of the cavity is higher, it has been conventionally difficult to achieve higher reflectance at the light-emitting facet of the cavity while maintaining high COD level.

From the foregoing, an object of the present invention is to provide a nitride semiconductor light-emitting device capable of achieving higher reflectance at a light-emitting facet of a cavity while maintaining a high COD level, as well as a method of manufacturing a nitride semiconductor light-emitting device.

The present invention is directed to a nitride semiconductor light-emitting device including a coating film and a reflectance control film successively formed on a light-emitting portion, the light-emitting portion being formed of a nitride semiconductor, the coating film being formed of an aluminum oxynitride film or an aluminum nitride film, and the reflectance control film being formed of an oxide film.

In addition, preferably, in the nitride semiconductor light-emitting device according to the present invention, the reflectance control film is formed of a stack of an aluminum oxide film and a silicon oxide film.

In addition, preferably, in the nitride semiconductor light-emitting device according to the present invention, oxygen content in the coating film is in a range from at least 0 atomic % to at most 35 atomic %.

In addition, preferably, in the nitride semiconductor light-emitting device according to the present invention, the light-emitting portion has reflectance of at least 18% with respect to light emitted from the nitride semiconductor light-emitting device.

In addition, preferably, in the nitride semiconductor light-emitting device according to the present invention, an aluminum oxide film and a stack of a silicon oxide film and a tantalum oxide film are successively formed on a light-reflection side.

In addition, preferably, in the nitride semiconductor light-emitting device according to the present invention, an aluminum oxide film and a stack of a silicon nitride film and a silicon oxide film are successively formed on a light-reflection side.

Moreover, the present invention is directed to a method of manufacturing a nitride semiconductor light-emitting device including a coating film and a reflectance control film successively formed on a light-emitting portion, and the method includes the steps of: forming the coating film formed of an aluminum oxynitride film or an aluminum nitride film on the light-emitting portion; and forming the reflectance control film formed of an oxide film on the coating film.

In the method of manufacturing a nitride semiconductor light-emitting device according to the present invention, a stack of an aluminum oxide film and a silicon oxide film is preferably formed as the reflectance control film.

In addition, in the method of manufacturing a nitride semiconductor light-emitting device according to the present invention, if the coating film is formed of an aluminum oxynitride film, the coating film may be formed by using aluminum oxide as a target.

According to the present invention, a nitride semiconductor light-emitting device capable of achieving higher reflectance at a light-emitting facet of a cavity while maintaining a high COD level, as well as a method of manufacturing a nitride semiconductor light-emitting device can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9A and 9B show results of theoretical calculation of reflectance spectrum at a light-emitting facet of a cavity of another exemplary nitride semiconductor laser device of the present invention

DESCRIPTION OF THE PREFERRED EMBODIMENTS

Figure 1:
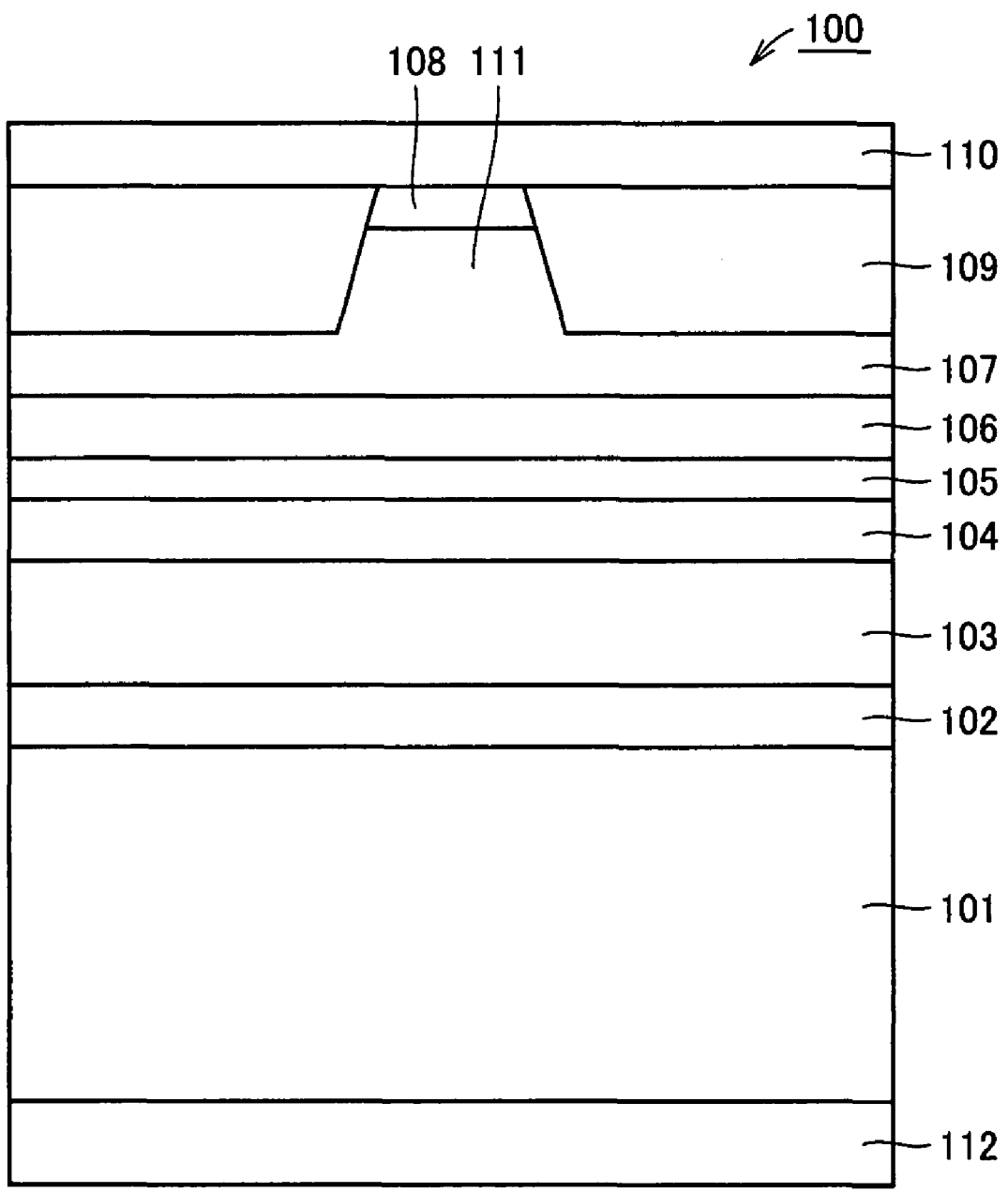
FIG. 1 is a schematic cross-sectional view of a preferred exemplary nitride semiconductor laser device representing a nitride semiconductor light-emitting device of the present invention.

An embodiment of the present invention will be described hereinafter. In the drawings of the present invention, it is noted that the same reference characters represent the same or corresponding elements.

FIG. 1 is a schematic cross-sectional view of a preferred exemplary nitride semiconductor laser device representing a nitride semiconductor light-emitting device of the present invention. Here, a nitride semiconductor laser device 100 is structured such that, through epitaxial growth, an n-type buffer layer 102 composed of n-type GaN having a thickness of 0.2 μm, an n-type clad layer 103 composed of n-type $Al_{0.06}Ga_{0.94}N$ having a thickness of 2.3 μm, an n-type guide layer 104 composed of n-type GaN having a thickness of 0.02 μm, a multiple quantum well active layer 105 constituted of a multiple quantum well layer composed of InGaN having a thickness of 4 nm and GaN having a thickness of 8 nm and a protection layer composed of GaN having a thickness of 70 nm, a p-type current blocking layer 106 composed of p-type $Al_{0.3}Ga_{0.7}N$ having a thickness of 20 nm, a p-type clad layer 107 composed of p-type $Al_{0.05}Ga_{0.95}N$ having a thickness of 0.5 μm, and a p-type contact layer 108 composed of p-type GaN having a thickness of 0.1 μm are successively stacked on a semiconductor substrate 101 composed of n-type GaN.

It should be noted that each layer has a composition ratio adjusted as appropriate and thus irrelevant to the essence of the present invention. In addition, a wavelength of a laser beam lased from the nitride semiconductor laser device of the present embodiment can be adjusted as appropriate, for example, in a range from at least 370 nm to at most 470 nm, depending on the composition ratio of multiple quantum well active layer 105. In the present embodiment, adjustment is made such that the laser beam at a wavelength of 405 nm is lased.

Nitride semiconductor laser device 100 is formed such that a stripe-shaped ridged stripe portion 111 extends in a direction of length of the cavity, by partially removing p-type clad layer 107 and p-type contact layer 108. Here, ridged stripe portion 111 has a stripe width, for example, in a range from approximately 1.2 μm to 2.4 μm, typically approximately 1.5 μm. It is noted that the stripe width of ridged stripe portion 111 of nitride semiconductor laser device 100 is not limited as such. The stripe width may be set, for example, in a range from approximately 2 μm to 100 μm, so that nitride semiconductor laser device 100 is applicable also as a broad area type nitride semiconductor laser device used for illumination purposes.

Moreover, a p electrode 110 formed as a stack of a Pd layer, an Mo layer, and an Au layer is provided on the surface of p-type contact layer 108, and an insulating film 109 formed as a stack of an $SiO_2$ film and a $TiO_2$ film is provided under p electrode 110, except for where ridged stripe portion 111 is formed. Further, an n electrode 112 formed as a stack of an Hf film and an Al film is formed on the surface of semiconductor substrate 101 opposite to where the above-described layers are stacked.

Figure 2:
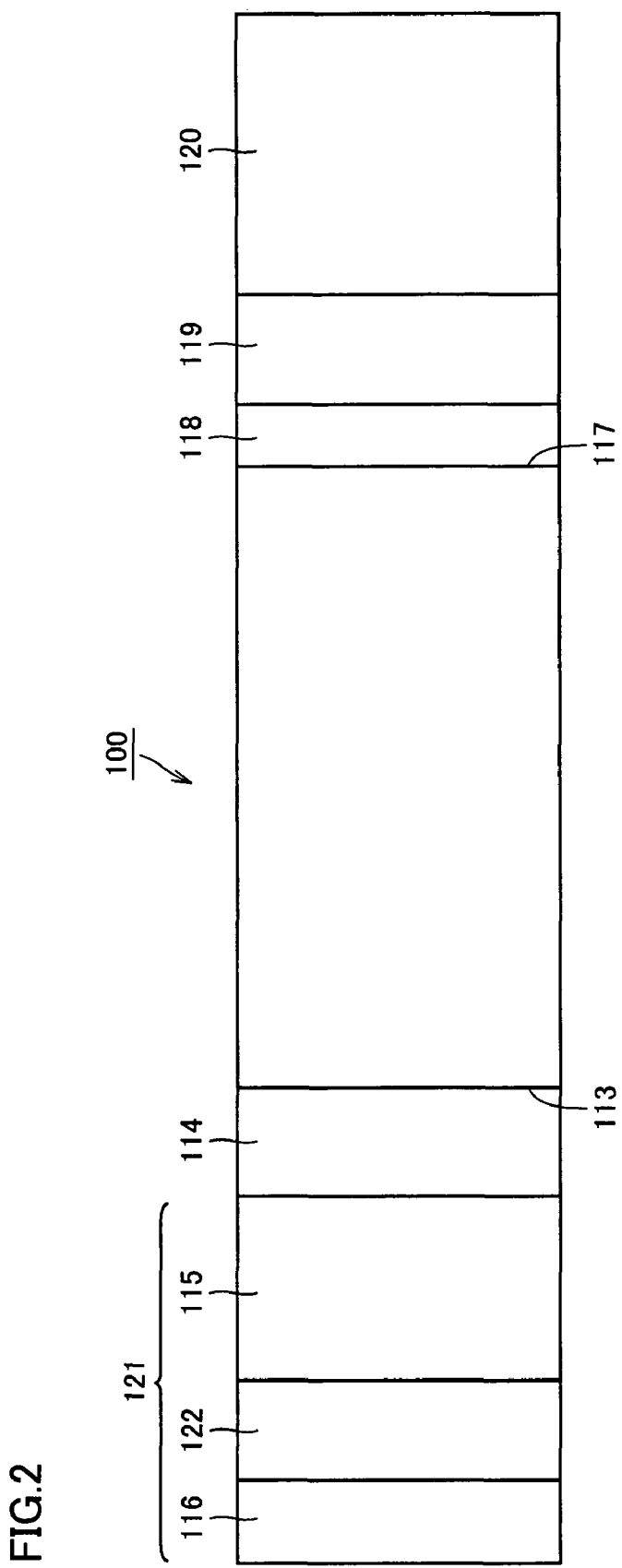
FIG. 2 is a schematic side view of the nitride semiconductor laser device shown in FIG. 1, in a direction of length of a cavity.

FIG. 2 is a schematic side view of nitride semiconductor laser device 100 shown in FIG. 1, in a direction of length of the cavity. Here, a coating film 114 formed of an aluminum oxynitride film having a thickness of 6 nm is formed on a light-emitting facet of cavity 113 of nitride semiconductor laser device 100, and an aluminum oxide film 115 having a thickness of 117 nm is formed on coating film 114. In addition, a silicon oxide film 122 having a thickness of 71 nm is formed on aluminum oxide film 115, and an aluminum oxide film 116 having a thickness of 60 nm is formed on silicon oxide film 122. Here, in the present embodiment, a reflectance control film 121 is formed of aluminum oxide film 115, silicon oxide film 122, and aluminum oxide film 116. Here, coating film 114 has an index of refraction of 2.1 with respect to light of a wavelength of 400 nm, and aluminum oxide film 115 has an index of refraction of 1.68 with respect to light of a wavelength of 400 nm. In addition, silicon oxide film 122 has an index of refraction of 1.43 with respect to light of a wavelength of 400 nm, and aluminum oxide film 116 has an index of refraction of 1.68 with respect to light of a wavelength of 400 nm. Accordingly, the reflectance at light-emitting facet of cavity 113 with respect to the laser beam of a wavelength of 405 nm lased from nitride semiconductor laser device 100 can be controlled to approximately 30%.

Meanwhile, on a light-reflecting facet of cavity 117 of nitride semiconductor laser device 100, an aluminum oxynitride film 118 having a thickness of 6 nm, an aluminum oxide film 119 having a thickness of 117 nm, and a high-reflection film 120 that is formed by stacking four pairs of a silicon oxide film having a thickness of 71 nm and a titanium oxide film having a thickness of 46 nm (starting from the silicon oxide film) and thereafter stacking a silicon oxide film having a thickness of 142 nm on an outermost surface are successively formed. Here, aluminum oxynitride film 118 has an index of refraction of 2.1 with respect to light of a wavelength of 400 nm, and aluminum oxide film 119 has an index of refraction of 1.68 with respect to light of a wavelength of 400 nm. Moreover, the silicon oxide film constituting high-reflection film 120 has an index of refraction of 1.43 with respect to light of a wavelength of 400 nm, and the titanium oxide film constituting high-reflection film 120 has an index of refraction of 2.4 with respect to light of a wavelength of 400 nm.

Accordingly, the reflectance at light-reflecting facet of cavity 117 with respect to the laser beam of a wavelength of 405 nm lased from nitride semiconductor laser device 100 can be controlled to approximately 95%.

Alternatively, by forming a plurality of films different in indices of refraction other than the films structured as described above on light-reflecting facet of cavity 117 of nitride semiconductor laser device 100, the reflectance of approximately 95% can be achieved. For example, an aluminum oxynitride film having a thickness of 6 nm and an aluminum oxide film having a thickness of 117 nm are successively formed on light-reflecting facet of cavity 117 of nitride semiconductor laser device 100, and thereafter a stack formed by stacking 6 pairs of a silicon oxide film having a thickness of 71 nm and a tantalum oxide film having a thickness of 51 nm (starting from the silicon oxide film) is formed and an aluminum oxide film having a thickness of 120 nm is formed on an outermost surface, thus forming a multi-layer film. Here, the tantalum oxide film has an index of refraction of 2.0 with respect to light of a wavelength of 400 nm.

Alternatively, an aluminum oxynitride film having a thickness of 6 nm and an aluminum oxide film having a thickness of 117 nm are successively formed on light-reflecting facet of cavity 117 of nitride semiconductor laser device 100, and thereafter a stack formed by stacking 7 pairs of a silicon nitride film having a thickness of 48 nm and a silicon oxide film having a thickness of 71 nm (starting from the silicon nitride film) is formed and a silicon oxide film having a thickness of 142 nm is formed on an outermost surface, thus forming a multi-layer film. Here, the silicon nitride film has an index of refraction of 2.1 with respect to light of a wavelength of 400 nm.

Coating film 114, reflectance control film 121, aluminum oxynitride film 118, aluminum oxide film 119, and high-reflection film 120 are formed on facet of cavity 113 and facet of cavity 117 of each sample, the sample being fabricated by successively stacking aforementioned nitride semiconductor layers such as a buffer layer on the semiconductor substrate described above, forming the ridged stripe portion, and thereafter cleaving a wafer where the insulating film, the p electrode and the n electrode are formed, to thereby expose cleavage planes, i.e., facet of cavity 113 and facet of cavity 117.

Prior to forming coating film 114 and reflectance control film 121 described above, facet of cavity 113 is preferably cleaned by heating to a temperature, for example, of at least 100° C. in a film deposition apparatus so as to remove an oxide film, an impurity and the like adhered to facet of cavity 113, however, in the present invention, it is not essential. Alternatively, facet of cavity 113 may be cleaned by irradiating facet of cavity 113, for example, with argon or nitrogen plasma, however, in the present invention, it is not essential. Alternatively, plasma irradiation while heating facet of cavity 113 may be adopted. In plasma irradiation described above, for example, nitrogen plasma irradiation may follow argon plasma irradiation, or vice versa. Other than argon and nitrogen, for example, a rare gas such as helium, neon, xenon, or krypton may be used. Forming of coating film 114 and reflectance control film 121 to be formed on facet of cavity 113 is preferably carried out at a heated temperature, for example, in a range from at least 100° C. to at most 500° C., however, in the present invention, coating film 114 and reflectance control film 121 may be formed without heating.

Coating film 114 and reflectance control film 121 described above may be formed, for example, with ECR (Electron Cyclotron Resonance) sputtering which will be described below, however, they may be formed with other various sputtering methods or CVD (Chemical Vapor Deposition) or EB (Electron Beam) vapor deposition.

Figure 3:
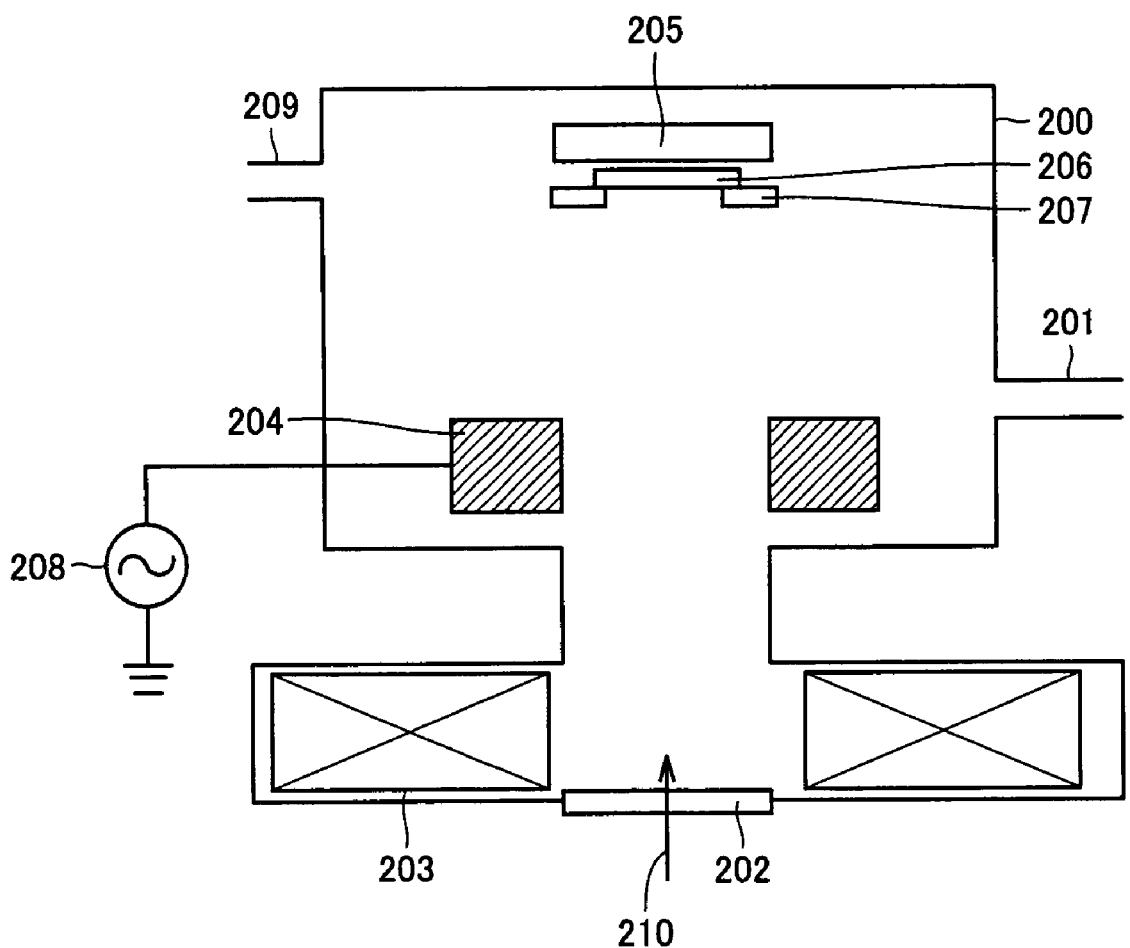
FIG. 3 is a schematic view of a configuration of an exemplary ECR sputtering film deposition apparatus.

FIG. 3 is a schematic view of a configuration of an exemplary ECR sputtering film deposition apparatus. Here, the ECR sputtering film deposition apparatus includes a film deposition chamber 200, a magnetic coil 203, and a microwave introduction window 202. In film deposition chamber 200, a gas inlet port 201 and a gas exhaust port 209 are provided, and an Al target 204 connected to an RF power supply 208 and a heater 205 are provided. In addition, in film deposition chamber 200, a sample carrier 207 is provided and a sample 206 is placed on sample carrier 207. Magnetic coil 203 is provided in order to produce magnetic field necessary for generating plasma, and RF power supply 208 is used for sputtering Al target 204. In addition, microwaves 210 are introduced into film deposition chamber 200 through microwave introduction window 202.

Gaseous nitrogen is introduced into film deposition chamber 200 through gas inlet port 201 at a flow rate of 5.5 sccm, and gaseous oxygen is introduced at a flow rate of 1.0 sccm. In addition, in order to efficiently generate plasma so as to increase a film deposition speed, gaseous argon is introduced at a flow rate of 20.0 sccm. It is noted that the oxygen content in coating film 114 can be varied by varying a ratio between the gaseous nitrogen and the gaseous oxygen in growth chamber 200. Moreover, in order to sputter Al target 204, RF power of 500 W is applied to Al target 204 and microwave power of 500 W necessary for generating plasma is applied, whereby coating film 114 composed of aluminum oxynitride having an index of refraction of 2.1 with respect to light of a wavelength of 400 nm can be formed at the film deposition rate of 1.7 angstrom/second.

It is noted that contents of aluminum, nitrogen and oxygen (atomic %) forming coating film 114 can be measured, for example, with AES (Auger Electron Spectroscopy). Alternatively, content of oxygen composing coating film 114 can be measured also with TEM-EDX (Transmission Electron Microscopy-Energy Dispersive X-ray Spectroscopy).

Figure 4:
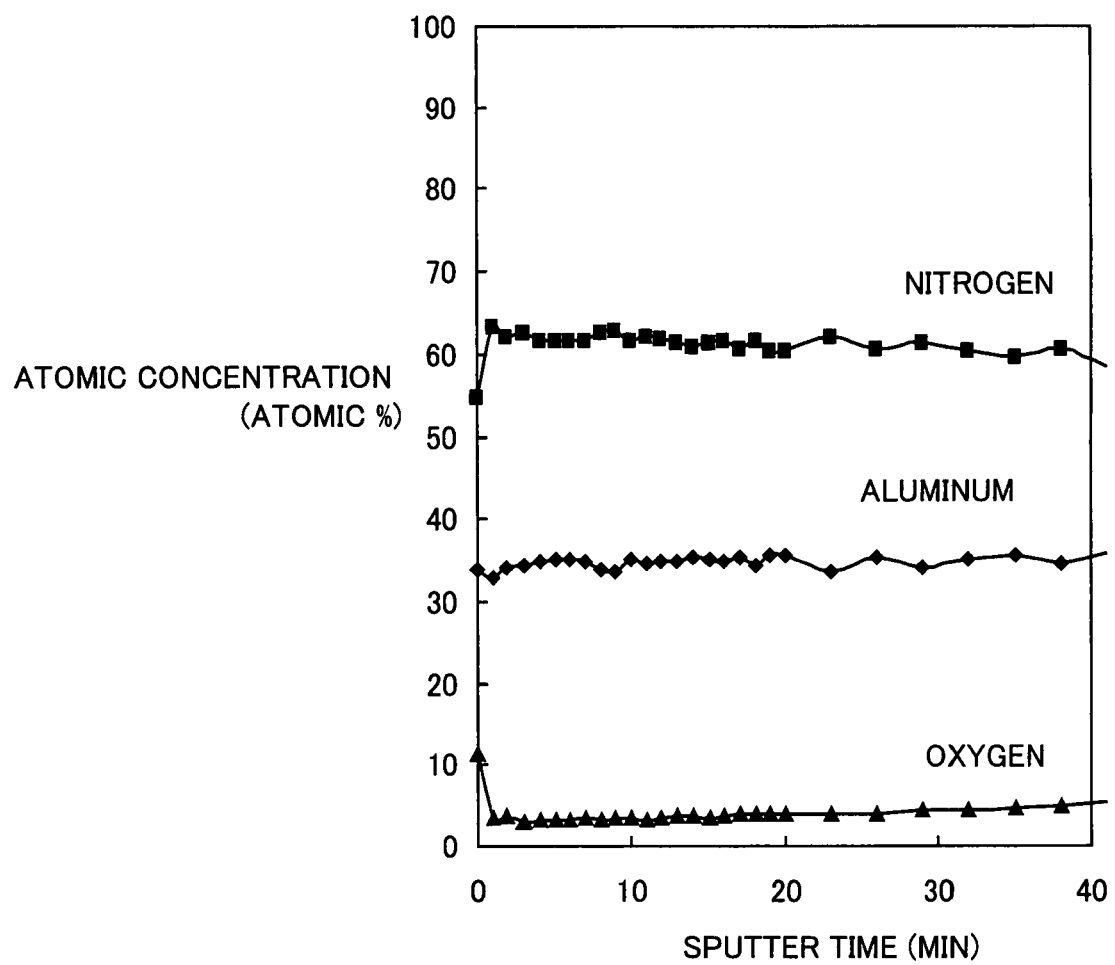
FIG. 4 shows results of analysis by using AES, in a direction of thickness, of a composition of aluminum oxynitride separately fabricated under the conditions the same as those for a coating film in an embodiment of the present invention.

FIG. 4 shows results of analysis by using AES, in a direction of thickness, of a composition of aluminum oxynitride separately fabricated under the same conditions and with the same method as described above. The contents of aluminum, oxygen and nitrogen, respectively, were obtained as based on an AES signal in intensity, with the sensitivity of a peak of each element considered. Herein, aluminum, oxide and nitrogen together assume 100 atomic % and an element other than aluminum, oxygen and nitrogen, contained in a small amount, such as argon, is excluded therefrom.

As shown in FIG. 4, it can be seen that the content of aluminum composing aluminum oxynitride is 34.8 atomic %, the content of oxygen is 3.8 atomic %, and the content of nitrogen is 61.4 atomic %, with a substantially uniform composition in the direction of thickness. It should be noted that, although not shown in FIG. 4, a negligible amount of argon was detected.

Thereafter, aluminum oxide film 115 is formed on coating film 114 with ECR sputtering. Here, aluminum oxide film 115 is fabricated, for example, as follows. Initially, in the ECR sputtering film deposition apparatus shown in FIG. 3, after coating film 114 is formed, the gaseous oxygen is introduced into film deposition chamber 200 through gas inlet port 201 at a flow rate of 6.5 sccm. In addition, in order to efficiently generate plasma so as to increase a film deposition speed, the gaseous argon is introduced at a flow rate of 40 sccm. Then, in order to sputter Al target 204, RF power of 500 W is applied to Al target 204 and microwave power of 500 W necessary for generating plasma is applied, whereby aluminum oxide film 115 having an index of refraction of 1.68 with respect to light of a wavelength of 400 nm is formed at the film deposition rate of 20 nm/second.

In succession, silicon oxide film 122 is formed on aluminum oxide film 115 using ECR sputtering. Here, silicon oxide film 122 is fabricated, for example, as follows. Initially, in the ECR sputtering film deposition apparatus shown in FIG. 3, Al target 204 is replaced with an Si target. After aluminum oxide film 115 is formed, the gaseous oxygen is introduced into film deposition chamber 200 through gas inlet port 201 at a flow rate of 7.5 sccm. In addition, in order to efficiently generate plasma so as to increase a film deposition speed, the gaseous argon is introduced at a flow rate of 20 sccm. Then, in order to sputter the Si target, RF power of 500 W is applied to the Si target and microwave power of 500 W necessary for generating plasma is applied, whereby silicon oxide film 122 having an index of refraction of 1.43 with respect to light of a wavelength of 400 nm is formed at the film deposition rate of 20 nm/second.

Thereafter, aluminum oxide film 116 is formed on silicon oxide film 122 using ECR sputtering. Here, aluminum oxide film 116 is fabricated, for example, as follows. Initially, in the ECR sputtering film deposition apparatus shown in FIG. 3, the Si target used for forming silicon oxide film 122 is replaced with the Al target. Then, the gaseous oxygen is introduced into film deposition chamber 200 through gas inlet port 201 at a flow rate of 6.5 sccm. In addition, in order to efficiently generate plasma so as to increase a film deposition speed, the gaseous argon is introduced at a flow rate of 40 sccm. Then, in order to sputter the Al target, RF power of 500 W is applied to the Al target and microwave power of 500 W necessary for generating plasma is applied, whereby aluminum oxide film 116 having an index of refraction of 1.68 with respect to light of a wavelength of 400 nm is formed at the film deposition rate of 20 nm/second. Thus, reflectance control film 121 constituted of aluminum oxide film 115, silicon oxide film 122, and aluminum oxide film 116 is formed on coating film 114.

Aluminum oxynitride film 118, aluminum oxide film 119, and high-reflection film 120 on light-reflecting facet of cavity 117 can also be formed with ECR sputtering, as in the case of coating film 114 and the like. Here, before forming these films, preferably, cleaning through heating and/or cleaning with plasma irradiation is also performed. It is noted here that deterioration of the light-emitting portion gives rise to a problem on the light-emitting side where optical density is great, whereas deterioration does not cause a problem on the light-reflection side in many cases because optical density is smaller on the light-reflection side than on the light-emitting side. Therefore, in the present invention, it is not necessary to provide a film such as an aluminum oxynitride film on light-reflecting facet of cavity 117. In addition, in the present embodiment, aluminum oxynitride film 118 having a thickness of 6 nm is formed on light-reflecting facet of cavity 117, however, aluminum oxynitride film 118 may have a greater thickness, for example, of 50 nm.

After the films described above are formed on light-emitting facet of cavity 113 and light-reflecting facet of cavity 117, heat treatment may be performed. Thus, removal of moisture contained in the films or improvement in film quality through heat treatment can be expected.

As described above, coating film 114, aluminum oxide film 115, silicon oxide film 122, and aluminum oxide film 116 are successively formed on light-emitting facet of cavity 113 of the sample, and aluminum oxynitride film 118, aluminum oxide film 119, and high-reflection film 120 are successively formed on light-reflecting facet of cavity 117. Thereafter, the sample is divided into chips, to thereby obtain nitride semiconductor laser devices 100 shown in FIG. 1.

Figure 5:
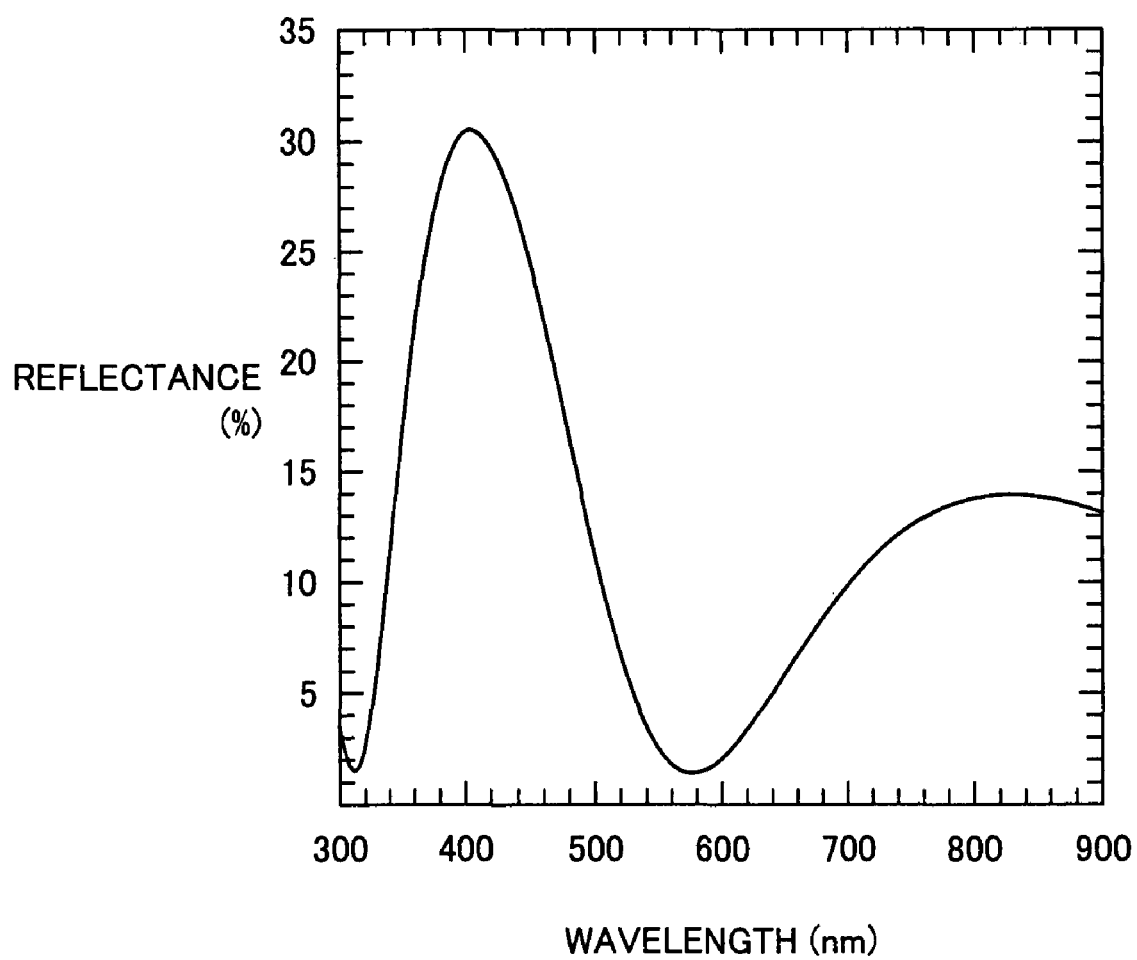
FIG. 5 shows results of theoretical calculation of reflectance spectrum at a light-emitting facet of the cavity of the nitride semiconductor laser device in the embodiment of the present invention.

FIG. 5 shows results of theoretical calculation of reflectance spectrum at light-emitting facet of cavity 113 of nitride semiconductor laser device 100 structured as described above. It can be seen from FIG. 5 that high reflectance of approximately 30% with respect to light of a wavelength of 405 nm can be obtained at light-emitting facet of cavity 113 of nitride semiconductor laser device 100.

Figure 6:
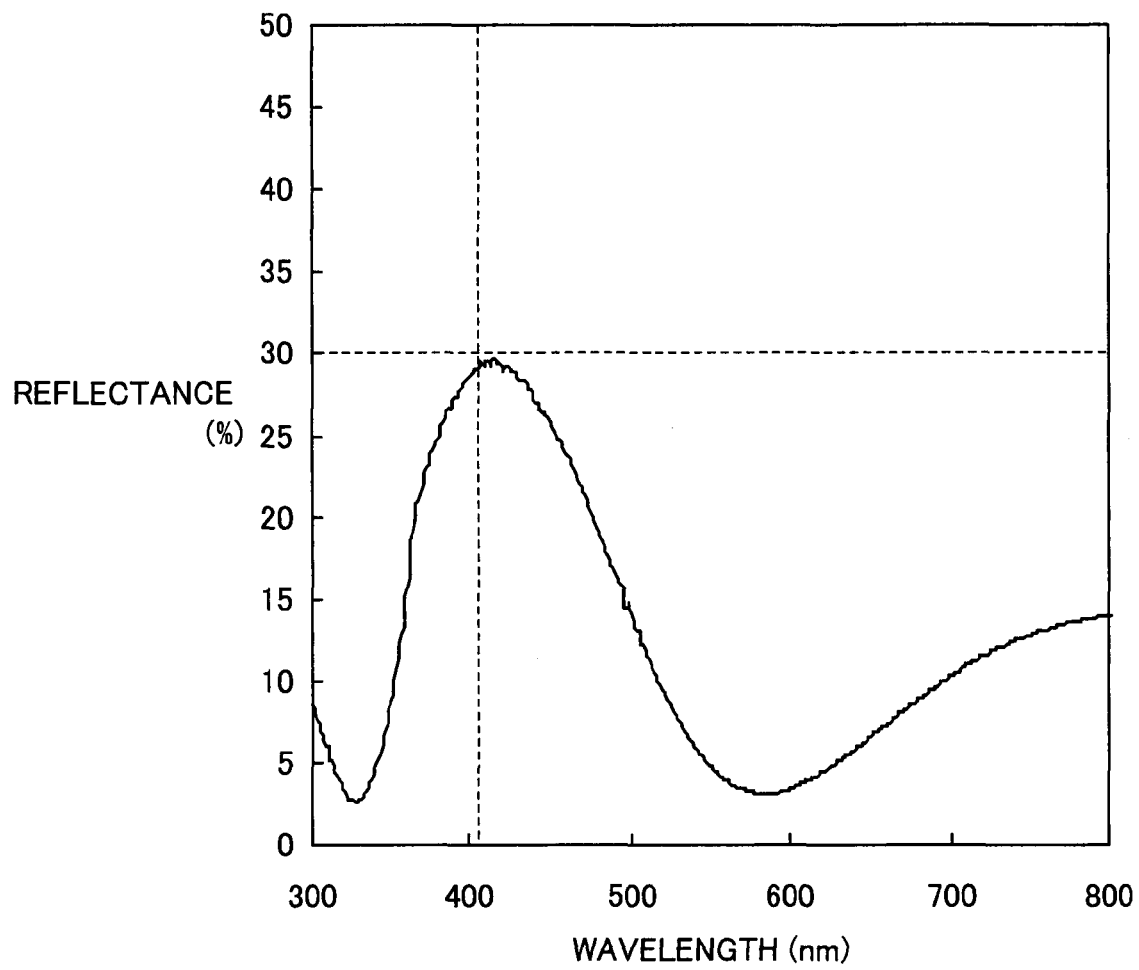
FIG. 6 shows results of actual measurement of reflectance spectrum at the light-emitting facet of the cavity of the nitride semiconductor laser device in the embodiment of the present invention.

FIG. 6 shows results of actual measurement of reflectance spectrum at light-emitting facet of cavity 113 of nitride semiconductor laser device 100 structured as described above. It can be seen from FIG. 6 that high reflectance of approximately 30% with respect to light of a wavelength of 405 nm can be obtained at light-emitting facet of cavity 113 of nitride semiconductor laser device 100, which is substantially the same as the theoretical calculation result shown in FIG. 5.

The theoretical calculation result of reflectance spectrum shown in FIG. 5 was obtained by theoretical calculation based on measurement of a thickness and an index of refraction with respect to light of a wavelength of 400 nm, of each layer forming nitride semiconductor laser device 100. Here, the thickness and the index of refraction with respect to light of a wavelength of 400 nm of each layer constituting nitride semiconductor laser device 100 were found using ellipsometry. In addition, the actual reflectance spectrum shown in FIG. 6 was found based on spectroscopy of white light and measurement of reflectance with respect to light of each wavelength.

Figure 7:
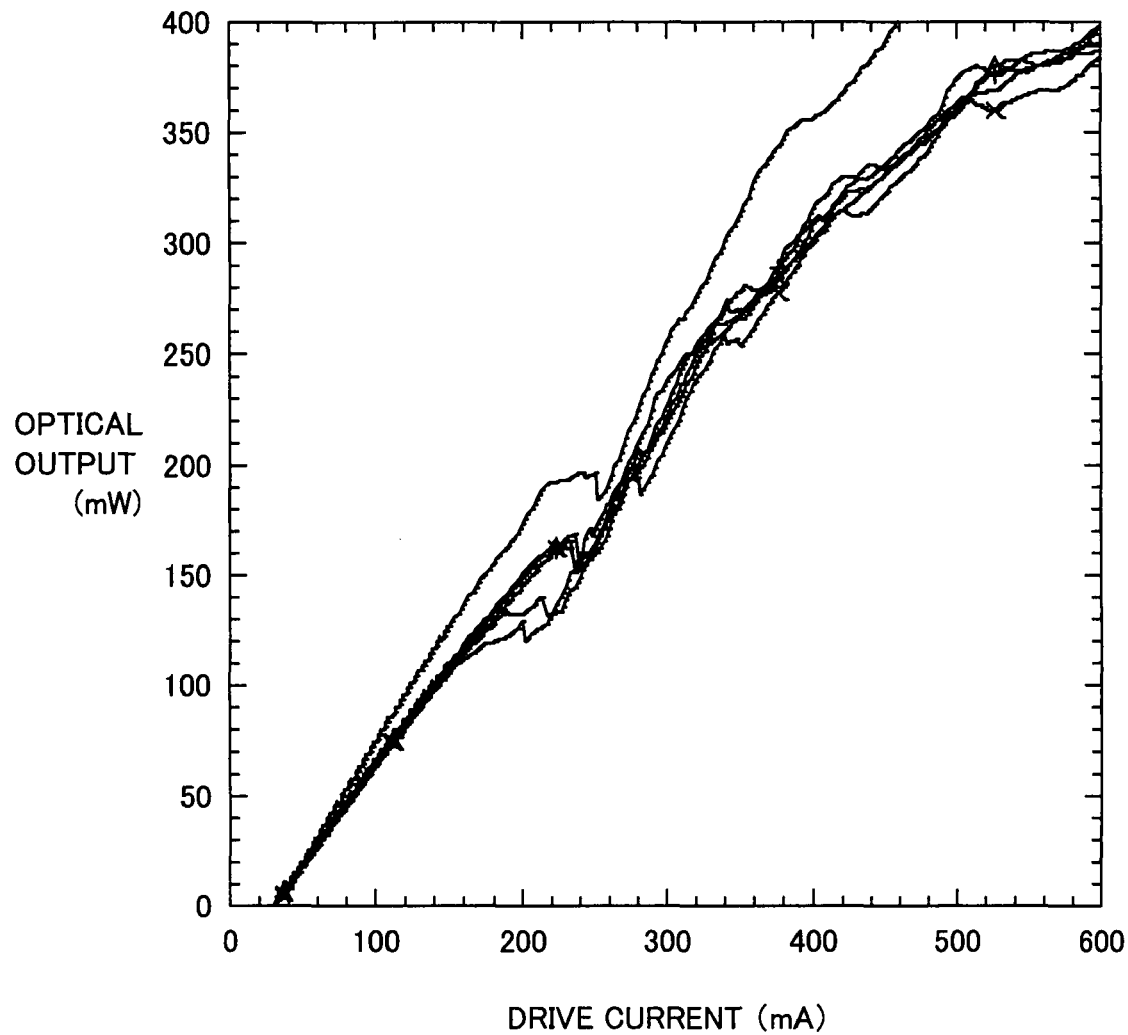
FIG. 7 shows results of examination of the COD level after aging, of the nitride semiconductor laser device in the embodiment of the present invention.

The COD level after aging (80° C., CW drive, optical output of 40 mW, 300 hours) of nitride semiconductor laser device 100 described above was examined, and the results are as shown in FIG. 7. As shown in FIG. 7, it was found that the COD level after aging of nitride semiconductor laser device 100 was very high around 350 to 400 mW.

Figure 10:
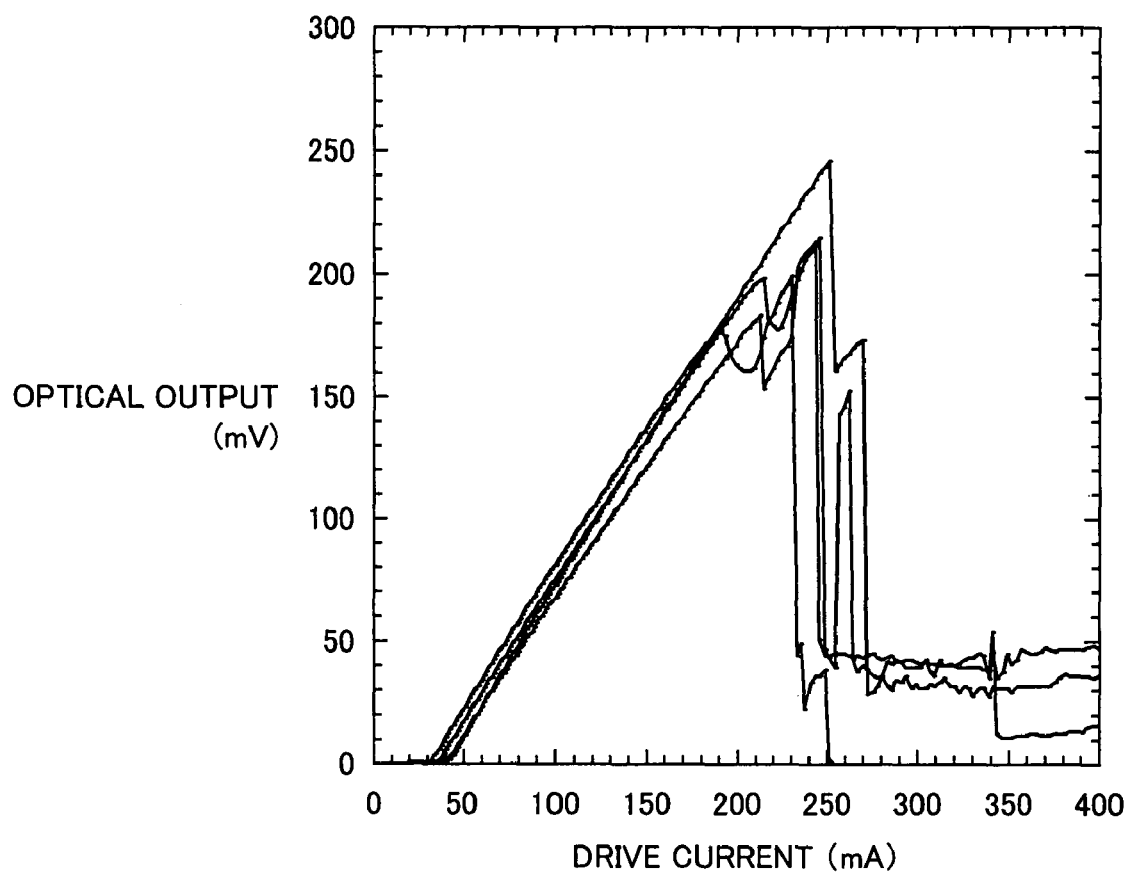
FIG. 10 shows results of examination of the COD level after aging, of a nitride semiconductor laser device according to a comparative example.

Alternatively, a nitride semiconductor laser device according to a comparative example, having a structure the same as nitride semiconductor laser device 100 except that reflectance control film 121 as above was directly formed on light-emitting facet of cavity 113 without coating film 114, was fabricated. Then, the COD level after aging (80° C., CW drive, optical output of 40 mW, 300 hours) of the nitride semiconductor laser device according to the comparative example was examined. The results are as shown in FIG. 10. As shown in FIG. 10, it was found that the COD level after aging of the nitride semiconductor laser device according to the comparative example was approximately 200 to 250 mW, which is significantly lower than that of nitride semiconductor laser device 100 described above.

The reason why the COD level after aging of nitride semiconductor laser device 100 was thus higher than that of the nitride semiconductor laser device according to the comparative example may be because the number of nonradiative centers at an interface between light-emitting facet of cavity 113 and coating film 114 decreased as a result of formation of coating film 114 on light-emitting facet of cavity 113 and/or because close contact between light-emitting facet of cavity 113 and coating film 114 was attained.

Figure 8:
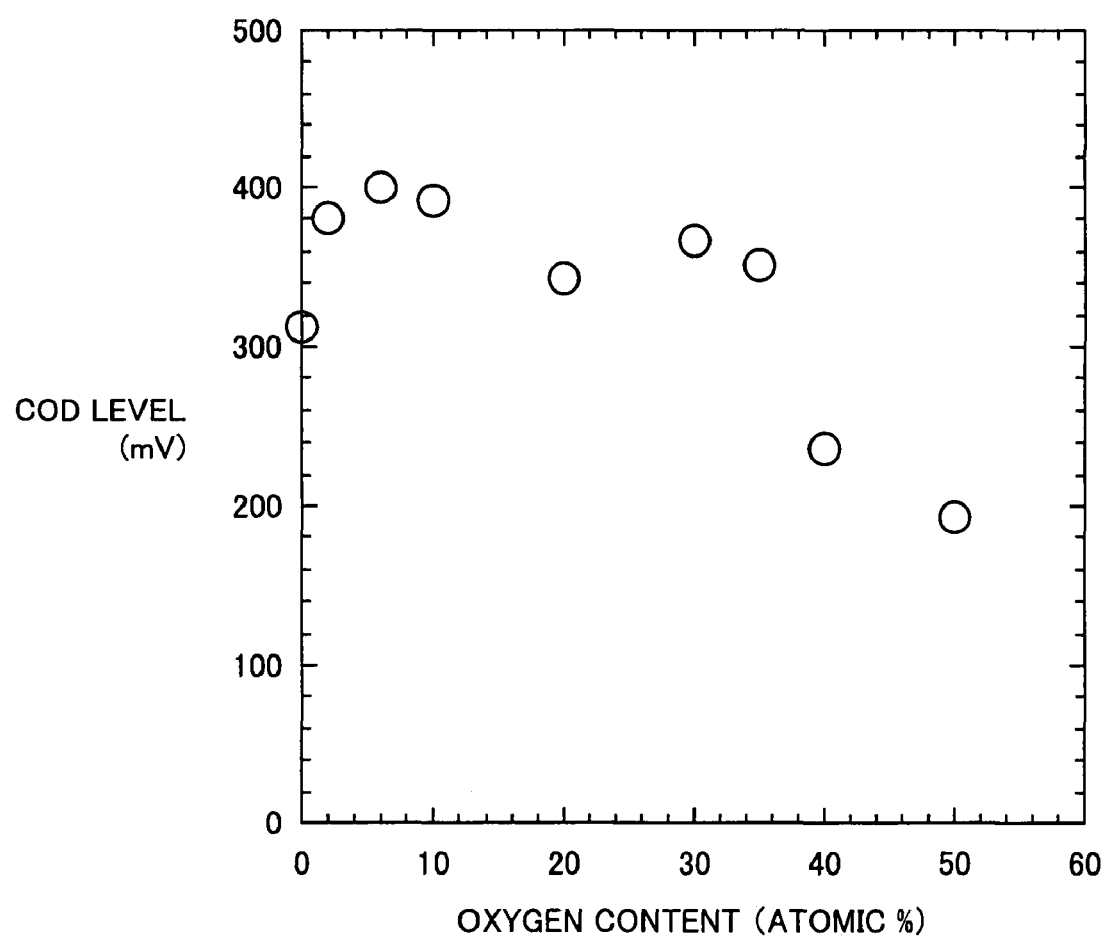
FIG. 8 shows results of examination of dependency on the COD level, of oxygen content in the coating film of the nitride semiconductor laser device in the embodiment of the present invention.

Thereafter, dependency on the COD level of the oxygen content in coating film 114 of nitride semiconductor laser device 100 was examined. The results are as shown in FIG. 8. Here, the oxygen content in coating film 114 was varied from 0 atomic % to 50 atomic %, and the COD level of nitride semiconductor laser device 100 after aging for 300 hours (300 hours, 80° C., optical output of 100 mW, CW drive) was measured. Here, when the oxygen content in coating film 114 is varied, the content of aluminum (atomic %) in coating film 114 hardly varies and the content of nitrogen (atomic %)

decreases in correspondence with increase in the content of oxygen (atomic %), because both of oxygen and nitrogen can basically bond to aluminum.

As shown in FIG. 8, it can be seen that, when the oxygen content in coating film 114 is in a range from at least 0 atomic % to at most 35 atomic %, in particular when the oxygen content in coating film 114 is in a range from at least 2 atomic % to at most 30 atomic %, the COD level tends to be very high at 300 mW or greater. Therefore, the oxygen content in coating film 114 formed on light-emitting facet of cavity 113 is preferably in a range from at least 0 atomic % to at most 35 atomic % and more preferably in a range from at least 2 atomic % to at most 30 atomic %, in which case the COD level after aging tends to improve. Naturally, when the oxygen content in coating film 114 is set to 0 atomic %, coating film 114 is formed of an aluminum nitride film, and when the oxygen content is greater than 0 atomic %, coating film 114 is formed of an aluminum oxynitride film.

As shown in FIG. 8, the reason why the COD level can be high when the oxygen content in coating film 114 formed on light-emitting facet of cavity 113 is in a range from at least 0 atomic % to at most 35 atomic % may be because close contact between facet of cavity 113 formed of a nitride semiconductor and coating film 114 is improved and generation of nonradiative recombination level due to oxidation of facet of cavity 113 does not affect the COD level.

When the oxygen content is set to 0 atomic %, the COD level is slightly lower. This may be because aluminum nitride composing coating film 114 has large internal stress and contact between facet of cavity 113 and coating film 114 becomes weaker. The present inventors, however, have found that the COD level improves when silicon nitride is contained in coating film 114 composed of aluminum nitride. This may be because silicon nitride mitigates the internal stress of aluminum nitride.

In addition, if the oxygen content in coating film 114 is greater than 35 atomic %, it is considered that a part of facet of cavity 113 formed of a nitride semiconductor is oxidized by oxygen contained in coating film 114 and such oxidation results in nonradiative recombination level, which has led to lower COD level.

FIG. 9A shows results of theoretical calculation of reflectance spectrum at light-emitting facet of cavity 113 of another exemplary nitride semiconductor laser device, that is structured similarly to nitride semiconductor laser device 100 described above except that coating film 114 formed of an aluminum nitride film having a thickness of 24 nm, a silicon oxide film having a thickness of 64 nm, an aluminum nitride film having a thickness of 24 nm, and an aluminum oxide film having a thickness of 24 nm are successively formed on light-emitting facet of cavity 113. Here, the aluminum nitride film has the index of refraction of 2.1 with respect to light of a wavelength of 400 nm, the silicon oxide film has the index of refraction of 1.43 with respect to light of a wavelength of 400 nm, and the aluminum oxide film has the index of refraction of 1.68 with respect to light of a wavelength of 400 nm.

FIG. 9B shows results of theoretical calculation of reflectance spectrum at light-emitting facet of cavity 113 of another exemplary nitride semiconductor laser device, that is structured similarly to nitride semiconductor laser device 100 described above except that coating film 114 formed of an aluminum nitride film having a thickness of 3 nm, an aluminum oxide film having a thickness of 117 nm, a silicon oxide film having a thickness of 71 nm, an aluminum oxide film having a thickness of 60 nm, a silicon oxide film having a thickness of 71 nm, and an aluminum oxide film having a thickness of 60 nm are successively formed on light-emitting facet of cavity 113. Here, the aluminum nitride film has the index of refraction of 2.1 with respect to light of a wavelength of 400 nm, the aluminum oxide film has the index of refraction of 1.68 with respect to light of a wavelength of 400 nm, and the silicon oxide film has the index of refraction of 1.43 with respect to light of a wavelength of 400 nm.

As can clearly be seen from comparison of FIGS. 5, 9A and 9B, the reflectance can be controlled by varying film structure on light-emitting facet of cavity 113.

It is noted that aluminum oxynitride discussed in the present invention may take any form in the present invention; aluminum oxide may be mixed in AlN, crystals of aluminum oxynitride may be present in AlN, or aluminum oxide and aluminum oxynitride may be present in AlN.

In the embodiment above, an example where the oxygen content in the coating film composed of aluminum oxynitride is substantially uniform in the direction of thickness has been described, however, a coating film having a multi-layer structure with the oxygen content gradually varied or different in the direction of thickness may be formed.

Meanwhile, in the embodiment above, preferably, coating film 114 has a thickness of at least 1 nm. If coating film 114 has a thickness less than 1 nm, it becomes difficult to control the thickness of coating film 114, and coating film 114 may not be formed on light-emitting facet of cavity 113. On the other hand, even when the thickness of coating film 114 is too large, it is assumed that the effect of the present invention is not impaired, although internal stress of coating film 114 may give rise to a problem. From the point of view of improvement in controllability of the thickness of coating film 114 and controllability of the reflectance at light-emitting facet of cavity 113, coating film 114 preferably has a thickness in a range from at least 3 nm to at most 50 nm.

The COD level of nitride semiconductor laser device 100 described above is significantly affected by coating film 114 on light-emitting facet of cavity 113, but not much affected by reflectance control film 121 on coating film 114. Therefore, in the present invention, reflectance control film 121 can be designed relatively freely, taking into consideration only the reflectance at light-emitting facet of cavity 113, and hence the degree of freedom in design remarkably improves.

In addition, in the embodiment above, if coating film 114 is formed of an aluminum oxynitride film, coating film 114 may also be formed, for example, with reactive sputtering, by providing a target composed of aluminum oxide in the film deposition chamber and introducing solely gaseous nitrogen into the film deposition chamber. If such a target composed of aluminum oxide is employed, the aluminum oxynitride film can be formed without intentionally introducing gaseous oxygen into the film deposition chamber.

In addition, in the embodiment above, in forming coating film 114 formed of an aluminum oxynitride film, as aluminum is highly prone to oxidation, control and reproduction of a composition of oxynitride low in oxygen content tends to be difficult when gaseous oxygen is introduced in the film deposition chamber. Here, however, by using aluminum oxide less oxidized and represented in a compositional formula $Al_xO_y$, (0<x<1, 0<y<0.6, x+y=1) as a target and by introducing solely gaseous nitrogen but not gaseous oxygen into the film deposition chamber, the aluminum oxynitride film low in oxygen content can relatively easily be formed. Moreover, a similar effect is obtained also when a target composed of aluminum oxynitride low in oxygen content is employed instead of the aforementioned target composed of aluminum oxide less oxidized and represented in a compositional formula $Al_xO_y$ (0<x<1, 0<y<0.6, x+y=1).

In addition, the oxygen content in the aluminum oxynitride film can be varied also by varying film deposition conditions such as a degree of vacuum and/or a film deposition temperature in the film deposition chamber, whereby the composition of the aluminum oxynitride film can be varied. It is noted that a smaller degree of vacuum in the film deposition chamber leads to a result that an oxide is more readily taken into the aluminum oxynitride film, while a higher film deposition temperature leads to a result that an oxide is less likely to be taken into the aluminum oxynitride film.

If film is deposited with sputtering using a target composed of Al (Al target) with the introduction of gaseous argon and gaseous nitrogen into the film deposition chamber after an inner wall of the film deposition chamber is oxidized or aluminum oxide is formed on the inner wall of the film deposition chamber, the inner wall of the film deposition chamber has oxygen departed because of plasma, and therefore, coating film 114 formed of the aluminum oxynitride film can be formed.

In the present invention, for example, a nitride semiconductor mainly composed of (at least 50 mass % of the total) AlInGaN (a compound of at least one group III element selected from the group of aluminum, indium and gallium and nitrogen representing group V elements) may be employed as the nitride semiconductor.

In the present invention, reflectance control film 121 is not particularly limited provided that it is formed of an oxide. Among others, however, a stack of an aluminum oxide film and a silicon oxide film is preferably used as reflectance control film 121. If reflectance control film 121 is formed of the stack of the aluminum oxide film and the silicon oxide film, fluctuation in the reflectance at light-emitting facet of cavity 113 with respect to fluctuation in the thicknesses of respective films constituting reflectance control film 121 is small, and therefore, the reflectance can be reproduced with excellent controllability. In the present invention, it is noted that the stack of the aluminum oxide film and the silicon oxide film constituting reflectance control film 121 may be formed in such a manner that at least one aluminum oxide film and at least one silicon oxide film are alternately stacked.

In addition, in the present invention, the reflectance at light-emitting facet of cavity 113 with respect to laser beams (laser beam of a wavelength, for example, in a range from at least 370 nm to at most 470 nm) lased from nitride semiconductor laser device 100 is preferably at least 18%, more preferably at least 30%, and further preferably at least 40%. When the reflectance at light-emitting facet of cavity 113 is 18% or greater, generally, optical density at facet of cavity 113 is increased and it is less likely that high COD level is obtained. In the present invention, however, as the coating film formed of the aluminum oxynitride film or the aluminum nitride film is formed on facet of cavity 113, it is likely that high COD level is obtained. On the other hand, when the reflectance at light-emitting facet of cavity 113 is 30% or greater, in particular 40% or greater, fluctuation in the reflectance with respect to thickness of each film constituting reflectance control film 121 can be made smaller by forming reflectance control film 121 with the stack of the aluminum oxide film and the silicon oxide film. Thus, it is likely that yield is improved.

The present invention is suitably used, for example, for a nitride semiconductor light-emitting device such as a nitride semiconductor laser device lasing at a wavelength in ultraviolet to green range, a nitride semiconductor laser device of a broad area type having a stripe of several tens μm in width and used for high-output applications, a nitride semiconductor light-emitting diode device lasing at a wavelength in ultraviolet to red range, or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light-emitting device comprising:
   a coating film on a light-emitting portion, said light-emitting portion being a side surface of said nitride semiconductor light-emitting device, and
   a reflectance control film on the coating film,
   said coating film essentially consisting of an aluminum oxynitride film and being in contact with said light-emitting portion,
   said reflectance control film being formed of a stack of an aluminum oxide film and a silicon oxide film, the reflectance control film being in contact with said coating film.

2. The nitride semiconductor light-emitting device according to claim 1, wherein an oxygen content in said coating film is in a range from at least 0 atomic % to at most 35 atomic %.

3. The nitride semiconductor light-emitting device according to claim 1, wherein said light-emitting portion with the coating film and the reflectance control film has a reflectance of at least 18% with respect to light emitted from the nitride semiconductor light-emitting device.

4. The nitride semiconductor light-emitting device according to claim 1, wherein an aluminum oxide film and a stack of a silicon oxide film and a tantalum oxide film are successively formed on a light-reflection side.

5. The nitride semiconductor light-emitting device according to claim 1, wherein an aluminum oxide film and a stack of a silicon nitride film and a silicon oxide film are successively formed on a light-reflection side.

6. A nitride semiconductor light-emitting device comprising:
   a coating film on a light-emitting portion, said light-emitting portion being a side surface of said nitride semiconductor light-emitting device, and
   a reflectance control film on the coating film,
   said coating film essentially consisting of an aluminum oxynitride film and being in contact with said light-emitting portion,
   said reflectance control film including two aluminum oxide layers with a third layer interposed in between the two aluminum oxide layers, the reflectance control film being in contact with said coating film.

7. The nitride semiconductor light-emitting device according to claim 6 wherein the third layer is formed of silicon oxide.

* * * * *